United States Patent
Kang

(10) Patent No.: US 7,800,958 B2
(45) Date of Patent: Sep. 21, 2010

(54) VOLTAGE GENERATING UNIT OF SEMICONDUCTOR MEMORY DEVICE

(75) Inventor: Khil-Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 68 days.

(21) Appl. No.: 12/206,422

(22) Filed: Sep. 8, 2008

(65) Prior Publication Data
US 2009/0067262 A1 Mar. 12, 2009

(30) Foreign Application Priority Data
Sep. 7, 2007 (KR) ...................... 10-2007-0090907

(51) Int. Cl.
*G11C 16/04* (2006.01)
(52) U.S. Cl. ............. 365/189.07; 365/194; 365/189.09; 365/233.1
(58) Field of Classification Search ............ 365/189.07, 365/194, 189.09, 233.1; 327/536–537
See application file for complete search history.

(56) References Cited

U.S. PATENT DOCUMENTS

| | | | | |
|---|---|---|---|---|
| 6,370,075 | B1 * | 4/2002 | Haeberli et al. | ........ 365/189.07 |
| 6,597,603 | B2 | 7/2003 | Lambrache et al. | |
| 7,075,853 | B2 | 7/2006 | Jeong et al. | |
| 7,266,031 | B2 * | 9/2007 | Kim et al. | .............. 365/189.09 |
| 7,446,594 | B2 * | 11/2008 | Yamane et al. | .............. 327/536 |
| 2005/0141319 | A1 | 6/2005 | Jang | |
| 2006/0273844 | A1 | 12/2006 | Lee | |

FOREIGN PATENT DOCUMENTS

| | | |
|---|---|---|
| JP | 2003-091991 | 3/2003 |
| JP | 2003-272396 | 9/2003 |
| KR | 1020060016641 | 2/2006 |
| KR | 1020060057974 | 5/2006 |

* cited by examiner

*Primary Examiner*—David Lam
(74) *Attorney, Agent, or Firm*—IP & T Law Firm PLC

(57) ABSTRACT

A voltage generating unit of a semiconductor memory device makes it possible to reduce a peak current value when generating a high voltage. The voltage generating unit of the semiconductor memory device includes a detecting unit configured to detect a voltage level of a high voltage by comparing a reference voltage with a fed-back high voltage, an oscillating unit configured to generate a plurality of clock signals with different operation time points on the basis of an output signal of the detecting unit, and a plurality of pumping units configured to generate the high voltage according to pumping control signals based on the clock signals.

19 Claims, 3 Drawing Sheets

VOLTAGE GENERATING UNIT OF SEMICONDUCTOR MEMORY DEVICE

CROSS-REFERENCES TO RELATED APPLICATION

The present invention claims priority of Korean patent application number 10-2007-0090907, filed on Sep. 7, 2007, which is incorporated by reference in its entirety.

BACKGROUND OF THE INVENTION

The present invention relates to semiconductor design technology, and more particularly to a voltage generating unit for generating a high voltage supplied to a semiconductor memory device.

Semiconductor memory devices are used in various fields and one of them is used to store various data. Such semiconductor memory devices require a large capacity, a high speed, a small size, and low power consumption because they are used in desktop computers, notebook computers, and a variety of portable devices.

A technique for minimizing current consumption in a core area of a memory is being proposed as a method for designing a semiconductor memory device with low power consumption. The core area includes memory cells, bit lines, and word lines and is designed according to an ultra-fine design rule. Thus, a power supply voltage is basically lowered in order to design a semiconductor memory device, which is ultra-fine and performs high frequency operation, and a power supply voltage of 1.5 V or below is used at present.

Since a semiconductor memory device requires a low external power supply voltage and high-speed operation, it secures a low voltage margin by boosting a word line (WL) voltage and improves a sensing speed of data from a memory cell. In general, for a cell including one transistor and one capacitor, a cell transistor is configured using an NMOS transistor that occupies a smaller area than a PMOS transistor. The NMOS transistor rapidly transfers logically low data, but transfers logically high data after detecting a drop of a threshold voltage. Thus, a high voltage VPP, which is a voltage higher than an external power supply voltage VDD by a threshold voltage of a cell transistor, is used in order to read/write a complete external power supply voltage VDD from/in a cell without a loss corresponding to a threshold voltage. A boosted external power supply voltage VDD is used in a semiconductor memory device because the high voltage VPP must be higher than the external power supply voltage VDD.

FIG. 1 is a block diagram of a conventional high voltage generator circuit of a semiconductor memory device.

Referring to FIG. 1, a conventional high voltage generator circuit of a semiconductor memory device includes a reference voltage generator 10, a detector circuit 11, an oscillator circuit 12, a control circuit 13, first, second and third pump circuits 14, 15 and 16, and a cell transistor 17. The reference voltage generator 10 generates a stable reference voltage VREF. The detector circuit 11 compares the reference voltage VREF with a fed-back high voltage VPP to detect a voltage level so that the high voltage VPP can maintain a constant voltage level. On the basis of an output signal VPPE of the detector circuit 11, the oscillator circuit 12 generates a clock signal OSC for generation of the high voltage VPP. In response to the clock signal OSC of the oscillator circuit 12, the control circuit 13 controls the first, second and third pump circuits 14, 15 and 16 that generate the high voltage VPP. The cell transistor 17 receives the high voltage VPP generated by the first, second and third pump circuits 14, 15 and 16.

The conventional high voltage generator circuit compares the fed-back high voltage VPP with the reference voltage VREF generated by the reference voltage generator 10, and outputs a voltage level detection signal VPPE from the detector circuit 11 if the fed-back high voltage VPP is lower than the reference voltage VREF. The voltage level detection signal VPPE drives the oscillator circuit 12, the clock signal OSC generated by the oscillator circuit 12 is converted by the control circuit 13 into square-wave signals P1 and P2 for control of the first, second and third pump circuits 14, 15 and 16, and the square-wave signals P1 and P2 is provided to the first, second and third pump circuits 14, 15 and 16.

When the fed-back high voltage VPP is lower than the reference voltage VREF, the first, second and third pump circuits 14, 15 and 16 receive the output signals P1 and P2 of the control circuit 13, generate the high voltage VPP, i.e., a boosted external power supply voltage VDD, and provide the generated high voltage VPP to the cell transistor 17. At this point, the first, second and third pump circuits 14, 15 and 16 are identical in circuit configuration, and simultaneously receive the output signal P1 and P2 from the control circuit 13 to generate the high voltage VPP, i.e., the boosted external power supply voltage VDD. Thus, the first, second and third pump circuits 14, 15 and 16 are operated in the same time period to generate the high voltage VPP.

However, the conventional high voltage generator circuit has the following limitations.

As described with reference to FIG. 1, the conventional high voltage generator circuit generates the high voltage VPP by operating the first, second and third pump circuits 14, 15 and 16 in the same time period on the basis of the clock signal OSC of the oscillator circuit 12, which is generated repeatedly in a predetermined cycle, while the fed-back high voltage VPP is lower than the reference voltage VREF. Due to such operation, the first, second and third pump circuits 14, 15 and 16 are operated in the same time period in response to the same signal, and thus the detected peak current value is equal to the sum of the use currents of the first, second and third pump circuits 14, 15 and 16, as illustrated in FIG. 2. Thus, the conventional high voltage generator circuit causes the peak current value to be very high.

As a result, the conventional high voltage generator circuit simultaneously drives the first, second and third pump circuits 14, 15 and 16 and thus increases the swing range of a VDD current used when the high voltage VPP is generated, thus increasing the current consumption, as illustrated in FIG. 2. When a peak current value becomes higher, an excessive voltage is generated according to the peak current value, thus increasing the power consumption.

SUMMARY OF THE INVENTION

Embodiments of the present invention are directed to providing a voltage generating unit of a semiconductor memory device, which makes it possible to reduce a peak current value when generating a high voltage.

In accordance with an aspect of the invention, there is provided a voltage generating unit of a semiconductor memory device, which includes a detecting unit configured to detect a voltage level of a high voltage by comparing a reference voltage with a fed-back high voltage, an oscillating unit configured to generate a plurality of clock signals with different operation time points on the basis of an output signal of the detecting unit, and a plurality of pumping units configured to generate the high voltage according to pumping control signals based on the clock signals.

In accordance with another aspect of the invention, there is provided a voltage generating unit of a semiconductor memory device, which includes an oscillating unit configured to generate a plurality of clock signals with a predetermined phase difference on the basis of an output signal of a detecting unit, a control signal generating unit configured to generate a plurality of control signal groups corresponding to the respective clock signals, and a plurality of pumping units configured to generate a high voltage in response to the control signal groups, respectively.

DESCRIPTION OF SPECIFIC EMBODIMENTS

Hereinafter, a high voltage generator circuit of a semiconductor memory device in accordance with the present invention will be described in detail with reference to the accompanying drawings.

Figure 1:
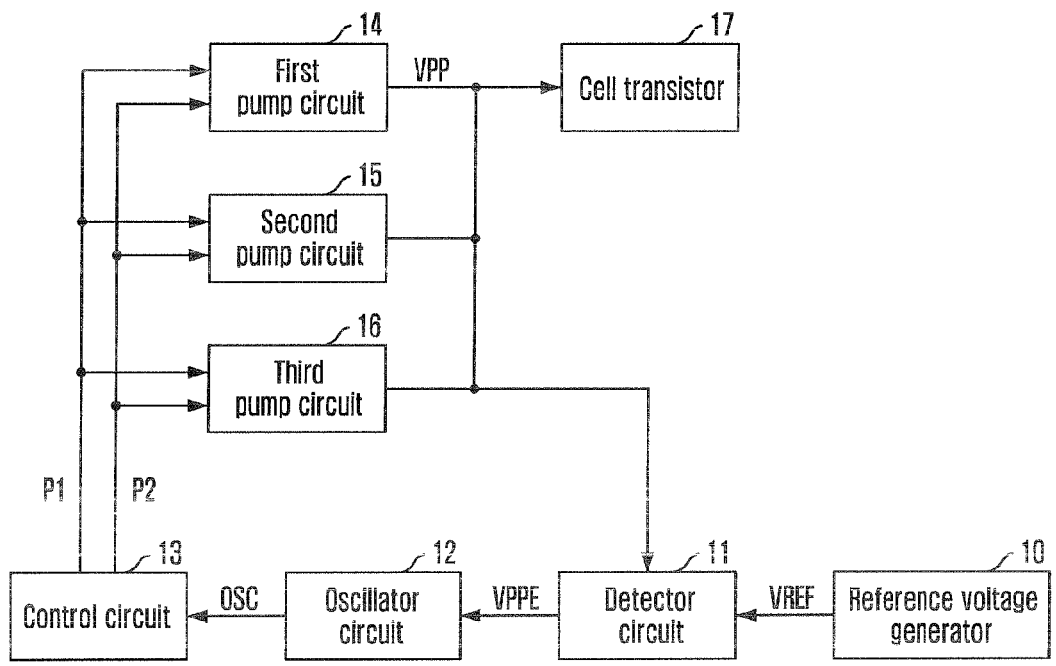
FIG. 1 is a block diagram of a conventional high voltage generator circuit of a semiconductor memory device.
Figure 2:
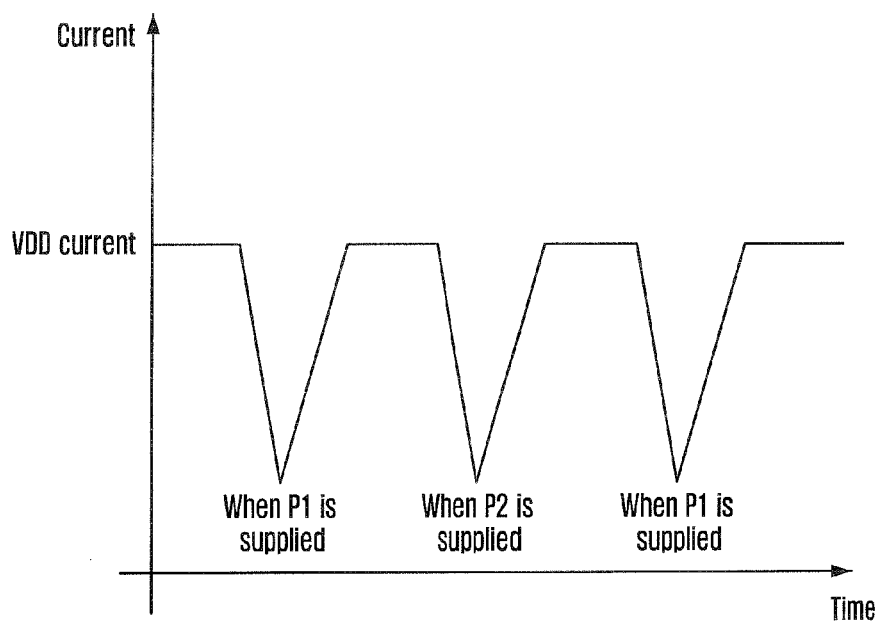
FIG. 2 is a graph illustrating a conventional peak current value detected when a high voltage is generated.
Figure 3:
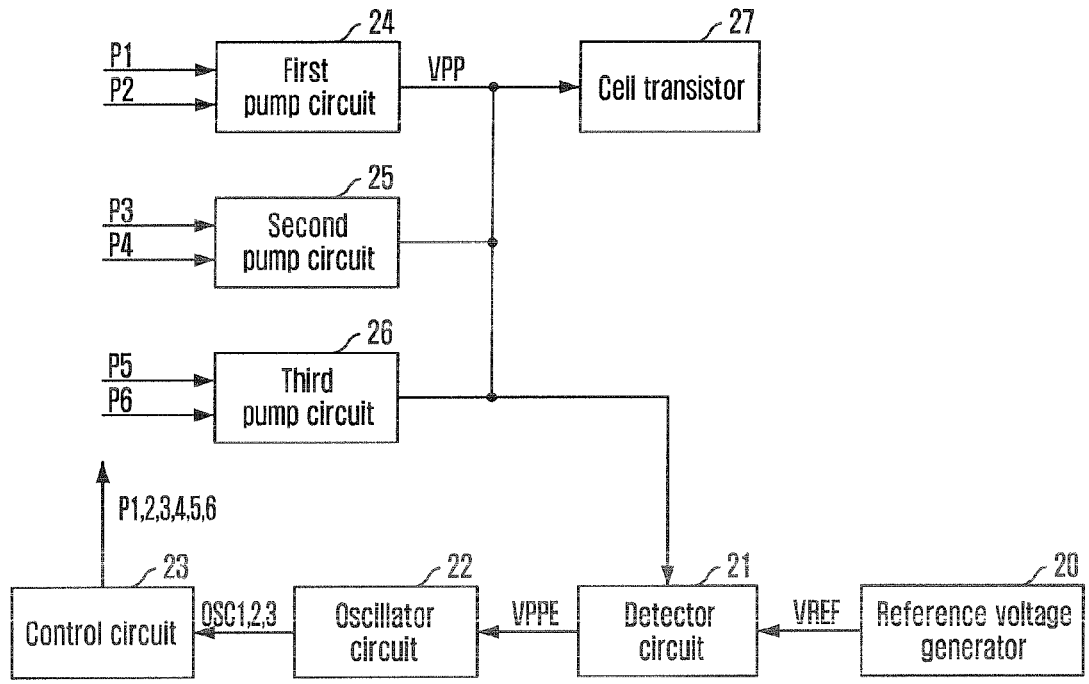
FIG. 3 is a block diagram of a high voltage generator circuit of a semiconductor memory device in accordance with an embodiment of the present invention.

FIG. 3 is a block diagram of a high voltage generator circuit of a semiconductor memory device in accordance with an embodiment of the invention.

Referring to FIG. 3, a high voltage generator circuit in accordance with an embodiment of the invention includes a reference voltage generator 20, a detector circuit 21, an oscillator circuit 22, a control circuit 23, first, second and third pump circuits 24, 25 and 26, and a cell transistor 27. The reference voltage generator 20 generates a stable reference voltage VREF. The detector circuit 21 compares the reference voltage VREF with a fed-back high voltage VPP to detect a voltage level so that the high voltage VPP can maintain a constant voltage level. On the basis of an output signal VPPE of the detector circuit 21, the oscillator circuit 22 generates first, second and third clock signals OSC1, OSC2 and OSC3 for generation of the high voltage VPP. In response to the clock signals OSC1, OSC2 and OSC3 of the oscillator circuit 22, the control circuit 23 controls the first, second and third pump circuits 24, 25 and 26 that generate the high voltage VPP. The cell transistor 27 receives the high voltage VPP generated by the first, second and third pump circuits 24, 25 and 26.

The oscillator circuit 22 generates the first clock signal OSC1 that serves a basis for driving the first pump circuit 24. Also, the oscillator circuit 22 generates the second clock signal OSC2 that serves a basis for driving the second pump circuit 25. Also, the oscillator circuit 22 generates the third clock signal OSC3 that serves a basis for driving the third pump circuit 26.

Figure 4:
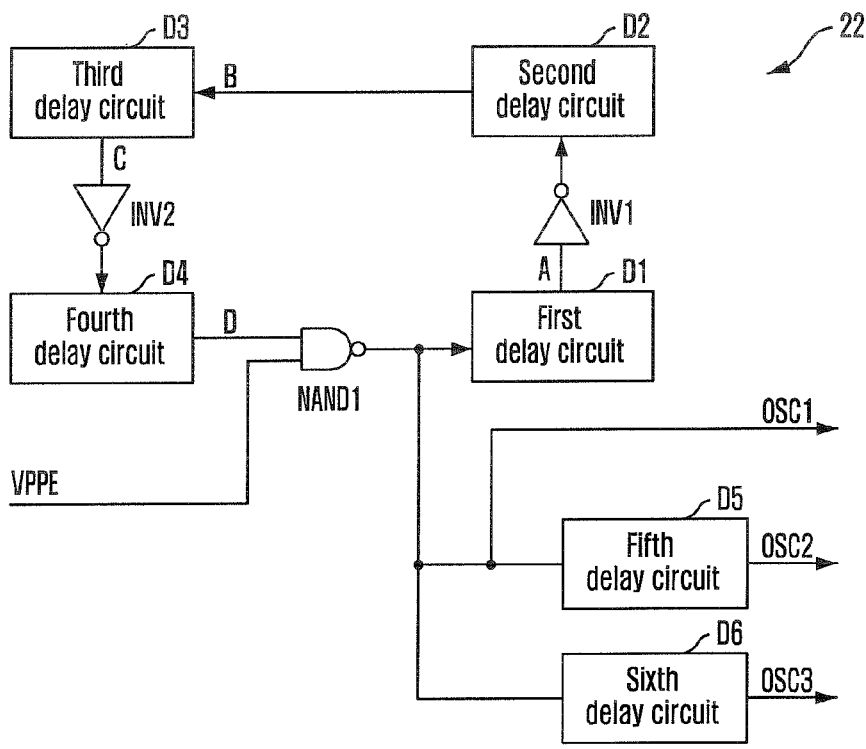
FIG. 4 is a diagram illustrating a detailed configuration of an oscillator circuit in accordance with an embodiment of the invention.

FIG. 4 is a diagram illustrating a detailed configuration of the oscillator circuit 22 in accordance with an embodiment of the invention.

Referring to FIG. 4, the oscillator circuit 22 is configured to generate three clock signals OSC1, OSC2 and OSC3. An output signal VPPE of the detector circuit 21 is a first input signal of a NAND gate NAND1, and an output signal of the NAND gate NAND1 is input to a first delay circuit D1, a first clock signal OSC1 output terminal, a fifth delay circuit D5, and a sixth delay circuit D6. The fifth delay circuit D5 delays the output signal of the NAND gate NAND1 by a time period T1, and the sixth delay circuit D6 delays the output signal of the NAND gate NAND1 by a time period T2. Herein, the time period T2 is designed to be longer than the time period T1.

That is, the output signal of the NAND gate NAND1 is output as the first clock signal OSC1. Also, the output signal of the NAND gate NAND1 is delayed by the time period T1 to be output as the second clock signal OSC2. Also, the output signal of the NAND gate NAND1 is delayed by the time period T2 to be output as the third clock signal OSC3.

An output signal A of the first delay circuit D1 is input to a first inverter INV1, and an output signal of the inverter INV1 is input to a second delay circuit D2. An output signal of the second delay circuit D2 is input to a third delay circuit D3, and an output signal of the third delay circuit D3 is input to a second inverter INV2. An output signal of the second inverter INV2 is input to a fourth delay circuit D4, and an output signal of the fourth delay circuit D4 is applied as a second input signal of the NAND gate NAND1.

On the basis of the first clock signal OSC1 generated by the oscillator circuit 22, the control circuit 23 generates output signals P1 and P2 for control of the first pump circuit 24. Herein, the output signal P1 and the output signal P2 are configured to have different phases. Also, on the basis of the second clock signal OSC2 generated by the oscillator circuit 22, the control circuit 23 generates output signals P3 and P4 for control of the second pump circuit 25. Herein, the output signal P3 and the output signal P4 are configured to have different phases. Also, on the basis of the third clock signal OSC3 generated by the oscillator circuit 22, the control circuit 23 generates output signals P5 and P6 for control of the third pump circuit 26. Herein, the output signal P5 and the output signal P6 are configured to have different phases.

The high voltage generator circuit in accordance with the invention operates as follows.

The reference voltage generator 20 generates a stable reference voltage VREF. The reference voltage VREF generated by the reference voltage generator 20 is input to a first input terminal of the detector circuit 21. Also, a high voltage VPP fed back from the pump circuits is input to a second input terminal of the detector circuit 21. The detector circuit 21 compares the fed-back high voltage VPP with the reference voltage VREF, and outputs a low-level signal VPPE if the high voltage VPP is higher than the reference voltage VREF. The low-level signal VPPE output from the detector circuit 21 is input to the oscillator circuit 22.

Since the low-level signal VPPE output from the detector circuit 21 is used as the first input signal of the NAND gate NAND1 in the oscillator circuit 22, the NAND gate NAND1 outputs a high-level signal regardless of its second input signal. The high-level signal output from the NAND gate NAND1 fixes all of the first clock signal OSC1, the second clock signal OSC2, and the third clock signal OSC3 of the oscillator circuit 22 at a high level. In this case, a constant-cycle clock signal required by the control circuit 23 fails to be generated, and thus the pump circuits are not operated.

However, when the fed-back high voltage VPP is lower than the reference voltage VREF, the detector circuit 21 outputs a high-level signal VPPE. The high-level signal VPPE output from the detector circuit 21 is input to the oscillator circuit 22.

The high-level signal VPPE output from the detector circuit 21 is applied as the first input signal of the NAND gate NAND1 of the oscillator circuit 22. If an initial signal of the second input signal D of the NAND gate NAND1 is a high-level signal, an output signal of the NAND gate NAND1 becomes a low-level signal. Thus, the first clock signal OSC1 of the oscillator circuit 22 becomes a low-level signal.

The low-level signal of the NAND gate NAND1 is input to the first delay circuit D1, and a low-level signal delayed by a predetermined time is output from the first delay circuit D1. The low-level signal output from the first delay circuit D1 is converted through the first inverter INV1 into a high-level signal, and the high-level signal is again delayed by a predetermined time by the first delay circuit D2 and the third delay circuit D3. The high-level signal output from the third delay circuit D3 is again converted through the second inverter INV2 into a low-level signal, and the low-level signal is delayed by a predetermined time by the fourth delay circuit D4 to be used as the second input signal of the NAND gate NAND1. Through the above process, the output signal of the NAND gate NAND1 changes from the low-level signal to the high-level signal.

Through the above operations, the oscillator circuit 22 outputs the first clock signal OSC1 with a predetermined cycle and outputs the second clock signal OSC2 by delaying the first clock signal OSC1 by the time period T1. Likewise, the oscillator circuit 22 outputs the third clock signal OSC3 by delaying the first clock signal OSC1 by the time period T2.

Meanwhile, the control circuit 23 uses the first clock signal OSC1 output from the oscillator circuit 22 to generate square-wave signals P1 and P2 with different phases, and the first pump circuit 24 is operated by the generated signals to generate the high voltage (VPP or 3VDD).

Figure 5:
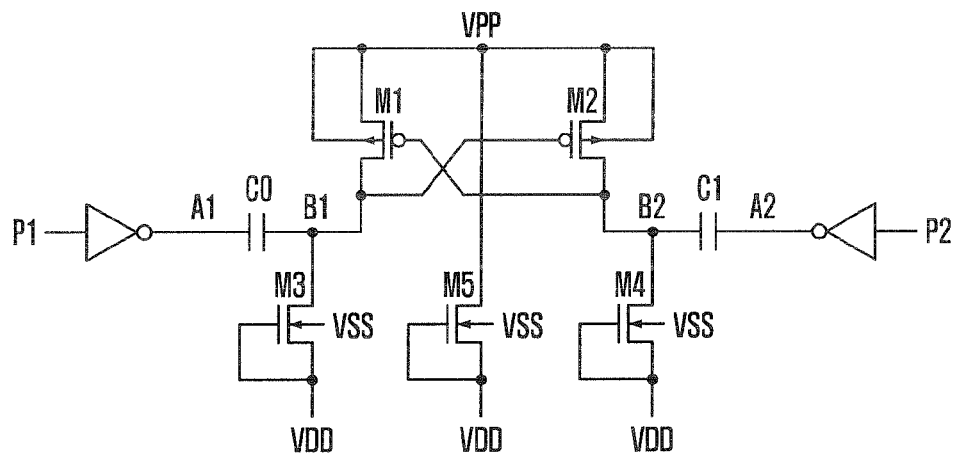
FIG. 5 is a diagram illustrating a detailed configuration of a pump circuit in accordance with an embodiment of the invention.

FIG. 5 is a diagram illustrating a detailed configuration of the pump circuit in accordance with an embodiment of the invention.

Referring to FIG. 5, a description will be given of an operation of the first pump circuit 24 that is operated using the square-wave signals P1 and P2 generated by the control circuit 23 on the basis of the first clock signal OSC1 generated by the oscillator circuit 22.

The control circuit 23 generates square-wave signals P1 and P2 with opposite phases in response to the first clock signal OSC1 generated by the oscillator circuit 22.

A high voltage (VPP) node of the first pump circuit 24 is initialized to a level of (VDD-Vt) by supply of an external power supply voltage VDD. Also, nodes B1 and B2 are initialized to the level of (VDD-Vt) by supply of the external power supply voltage VDD. Thereafter, when the output signal P1 of the control circuit 23 changes from high level to low level, a node A1 changes from low level to high level. At this point, the level of the node B1 increases from an initial level of VDD to a level of 2VDD by a capacitor operation.

Meanwhile, since the output signal P2 of the control circuit 23 has an opposite phase to the output signal P1, the node B2 is in an initial VDD state. At this point, the VDD power supply voltage turns on a transistor M1 and thus the increased 2VDD voltage of the node B1 is transferred to a high voltage output node VPP. Thus, the voltage of the high voltage output node VPP increases from the initial VDD state by 2VDD to 3VDD and the resulting voltage is supplied to the cell transistor 27.

Likewise, when the output signal P2 of the control circuit 23 changes from high level to low level, a node A2 changes from low level to high level and the level of the node B2 increases from a VDD state to a level of 2VDD by a capacitor operation. At this point, since the node B1 is in an initial VDD state due to the output signal P1 with an opposite phase to the output signal P2, a transistor M2 is turned on to transfer the increased 2VDD voltage of the node B2 to the output node VPP.

Also, the second pump circuit 25 and the third pump circuit 26 operate in the same manner as the first pump circuit 24 with the exception of different operation times. Thus, the control circuit 23 uses the second clock signal OSC2, delayed by the time period T1 relative to the first clock signal OSC1 output from the oscillator circuit 22, to generate square-wave signals P3 and P4 with different phases, and the second pump circuit 25 is operated by the generated signals to generate the high voltage VPP. Also, the control circuit 23 uses the third clock signal OSC3, delayed by the time period T2 relative to the first clock signal OSC1 output from the oscillator circuit 22, to generate square-wave signals P5 and P6 with different phases, and the third pump circuit 26 is operated by the generated signals to generate the high voltage VPP.

Figure 6:
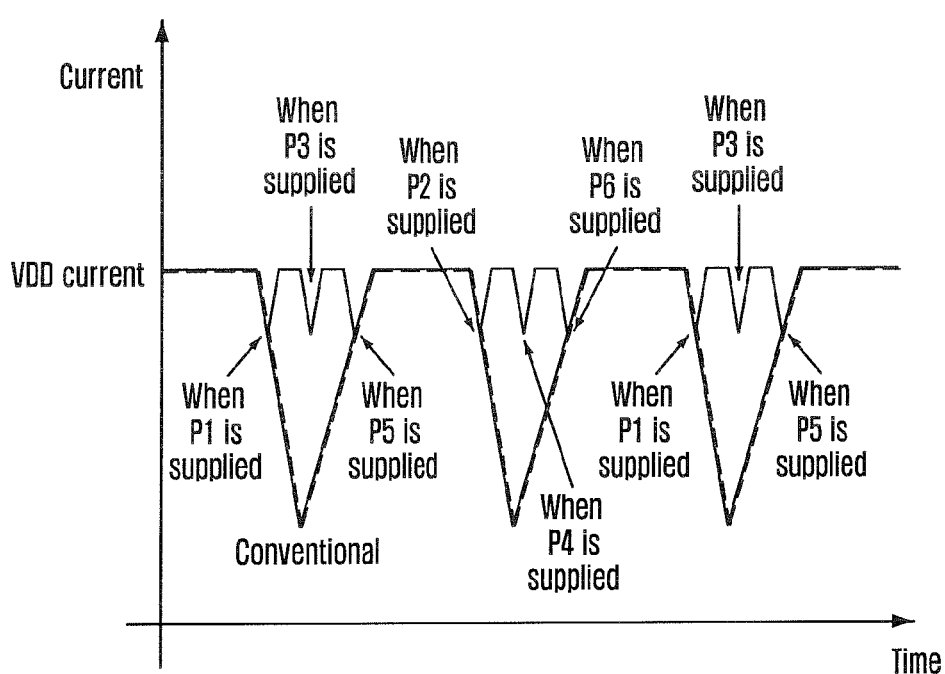
FIG. 6 is a graph illustrating a peak current value detected when a high voltage is generated according to the invention.

The pump circuits of the conventional high voltage generator circuit operate in the same time period. However, as described above, the invention controls the first, second and third pump circuits to operate serially so that the VDD current can be consumed by the respective pump circuits in a distributed manner. FIG. 6 is a graph illustrating a peak current value according to the invention. As illustrated in FIG. 6, the three pump circuits use the peak VDD current in the respective delay time periods by ⅓ without using the peak VDD current simultaneously, thereby making it possible to reduce the peak current in comparison with the conventional high voltage generator circuit. In particular, as illustrated in FIG. 6, the distributed operation of the pump circuits reduces the VDD current swing range of each pump circuit when generating the high voltage, thus making it possible to reduce the current consumption. Furthermore, the invention reduces the VDD current to suppress the generation of an excessive voltage, thus making it possible to reduce the power consumption.

As described above, the high voltage generator circuit of a semiconductor memory device in accordance with the invention controls the oscillator circuit to generate a plurality of clock signals with a predetermined delay time difference. Also, using the clock signals generated by the oscillator circuit, the high voltage generator circuit controls the pump circuits to operate in a distributed manner at different time points. Accordingly, the invention reduces the peak current consumed when generating the high voltage VPP by the high voltage generator circuit, to suppress the generation of an excessive voltage, thus making it possible to reduce the power consumption.

While the invention has been described with respect to the specific embodiments, it will be apparent to those skilled in the art that various changes and modifications may be made without departing from the spirit and scope of the invention as defined in the following claims.

What is claimed is:

1. A voltage generating unit of a semiconductor memory device, comprising:
   a detecting unit configured to detect a voltage level of a high voltage by comparing a reference voltage with a fed-back high voltage;
   an oscillating unit configured to generate a plurality of clock signals with different operation time points on the basis of an output signal of the detecting unit;
   a control unit configured to generate a plurality of pumping control signals corresponding to the respective clock signals;

a plurality of pumping units configured to generate the high voltage according to the pumping control signals.

2. The voltage generating unit as recited in claim 1, wherein the oscillating unit includes:
   a first clock signal generator configured to generate a first clock signal with a predetermined cycle on the basis of the output signal of the detecting unit;
   a second clock signal generator configured to generate a second clock signal that is delayed by a first time period relative to the predetermined cycle of the first clock signal; and
   a third clock signal generator configured to generate a third clock signal that is delayed by a second time period relative to the predetermined cycle of the first clock signal.

3. The voltage generating unit as recited in claim 2, wherein the first clock signal generator includes:
   a NAND gate configured to receive the output signal of the detecting unit as a first input signal thereof;
   a first delay circuit configured to delay an output signal of the NAND gate by a third time period and provide the resulting signal as a second input signal of the NAND gate; and
   an output terminal configured to output the output signal of the NAND gate as the first clock signal.

4. The voltage generating unit as recited in claim 3, wherein the second clock signal generator includes a second delay circuit configured to delay the output signal of the NAND gate by the first time period.

5. The voltage generating unit as recited in claim 4, wherein the third clock signal generator includes a third delay circuit configured to delay the output signal of the NAND gate by the second time period.

6. The voltage generating unit as recited in claim 2, wherein the second time period of the third delay circuit is set to be longer than the first time period of the second delay circuit.

7. The voltage generating unit as recited in claim 2, wherein the control unit is configured to:
   generate a first pumping control signal and a second pumping control signal, which are complementary in phase, on the basis of the first clock signal;
   generate a third pumping control signal and a fourth pumping control signal, which are complementary in phase, on the basis of the second clock signal; and
   generate a fifth pumping control signal and a sixth pumping control signal, which are complementary in phase, on the basis of the third clock signal.

8. The voltage generating unit as recited in claim 7, wherein the pumping units include:
   a first pumping unit configured to generate the high voltage using an external power supply voltage in response to the first and second pumping control signals;
   a second pumping unit configured to generate the high voltage using the external power supply voltage in response to the third and fourth pumping control signals; and
   a third pumping unit configured to generate the high voltage using the external power supply voltage in response to the fifth and sixth pumping control signals,
   wherein the first, second and third pumping units operate in a distributed manner.

9. The voltage generating unit as recited in claim 1, further comprising a reference voltage generating unit configured to generate the reference voltage applied to the detecting unit.

10. The voltage generating unit as recited in claim 1, further comprising a cell transistor configured to operate by receiving the high voltage generated by the pumping units.

11. A voltage generating unit of a semiconductor memory device, comprising:
    an oscillating unit configured to generate a plurality of clock signals with a predetermined phase difference on the basis of an output signal of a detecting unit;
    a control signal generating unit configured to generate a plurality of control signal groups corresponding to the respective clock signals; and
    a plurality of pumping units configured to generate a high voltage in response to the control signal groups, respectively.

12. The voltage generating unit as recited in claim 11, wherein the oscillating unit includes:
    a first clock signal generator configured to generate a first clock signal with a predetermined cycle;
    a second clock signal generator configured to generate a second clock signal that is delayed by a first time period relative to the predetermined cycle of the first clock signal; and
    a third clock signal generator configured to generate a third clock signal that is delayed by a second time period relative to the predetermined cycle of the first clock signal.

13. The voltage generating unit as recited in claim 12, wherein the first clock signal generator includes:
    a NAND gate configured to receive an oscillator operation control signal as a first input signal thereof;
    a first delay circuit configured to delay an output signal of the NAND gate by a third time period and provide the resulting signal as a second input signal of the NAND gate; and
    an output terminal configured to output the output signal of the NAND gate as the first clock signal.

14. The voltage generating unit as recited in claim 13, wherein the second clock signal generator includes a second delay circuit configured to delay the output signal of the NAND gate by the first time period.

15. The voltage generating unit as recited in claim 14, wherein the third clock signal generator includes a third delay circuit configured to delay the output signal of the NAND gate by the second time period.

16. The voltage generating unit as recited in claim 12, wherein the second time period of the third delay circuit is set to be longer than the first time period of the second delay circuit.

17. The voltage generating unit as recited in claim 12, wherein the control signal generating unit is configured to:
    generate a first pumping control signal and a second pumping control signal, which belong to a first control signal group and are different in phase from each other, on the basis of the first clock signal;
    generate a third pumping control signal and a fourth pumping control signal, which belong to a second control signal group and are different in phase from each other, on the basis of the second clock signal; and
    generate a fifth pumping control signal and a sixth pumping control signal, which belong to a third control signal group and are different in phase from each other, on the basis of the third clock signal.

18. The voltage generating unit as recited in claim 17, wherein the pumping units includes:
    a first pumping unit configured to generate the high voltage using an external power supply voltage in response to the first and second pumping control signals;

a second pumping unit configured to generate the high voltage using the external power supply voltage in response to the third and fourth pumping control signals; and a third pumping unit configured to generate the high voltage using the external power supply voltage in response to the fifth and sixth pumping control signals, wherein the first, second and third pumping units operate in a distributed manner.

19. The voltage generating unit as recited in claim 11, further comprising a cell transistor configured to operate by receiving the high voltage generated by the pumping units.

* * * * *